(12) United States Patent
Qiu et al.

(10) Patent No.: US 9,997,226 B2
(45) Date of Patent: Jun. 12, 2018

(54) TECHNIQUES TO MODULATE SPIN ORBIT SPIN TRANSFER TORQUES FOR MAGNETIZATION MANIPULATION

(71) Applicant: National University of Singapore, Singapore (SG)

(72) Inventors: Xuepeng Qiu, Singapore (SG); William Sylvain Legrand, Singapore (SG); Hyunsoo Yang, Singapore (SG)

(73) Assignee: National University of Singapore, Singapore (SG)

( * ) Notice: Subject to any disclaimer, the term of this patent is extended or adjusted under 35 U.S.C. 154(b) by 0 days. days.

(21) Appl. No.: 15/402,978

(22) Filed: Jan. 10, 2017

(65) Prior Publication Data
US 2017/0200486 A1    Jul. 13, 2017

(30) Foreign Application Priority Data
Jan. 11, 2016    (SG) ........................... 10201600175Y

(51) Int. Cl.
*G11C 11/16*    (2006.01)
*H01L 43/02*    (2006.01)
(Continued)

(52) U.S. Cl.
CPC ........ *G11C 11/161* (2013.01); *G11C 11/1675* (2013.01); *H01L 27/228* (2013.01); *H01L 43/02* (2013.01); *H01L 43/08* (2013.01)

(58) Field of Classification Search
CPC .............................. G11C 11/16; H01L 27/228
(Continued)

(56) References Cited

U.S. PATENT DOCUMENTS 8,310,863 B2    11/2012 Sun et al.
9,076,537 B2 *    7/2015 Khvalkovskiy ....... H01L 27/228
(Continued)

OTHER PUBLICATIONS

Emori, et al., "Interfacial current-induced torques in Pt/Co/GdOx", Applied Physics Letters, 2012, vol. 101, Jul. 24, 2012, pp. 042405-1 to 042405-4.
(Continued)

*Primary Examiner* — Son Mai
(74) *Attorney, Agent, or Firm* — Cesari and McKenna, LLP; James A. Blanchette

(57) ABSTRACT

In one embodiment, a SO-STT device has a non-symmetric device geometry. The device may be fabricated to have a non-symmetric magnetic pattern by tilting a shaped magnetic pattern (e.g., an ellipse, diamond, rectangle, etc. shaped magnetic pattern) such that the pattern's main (long and short) axes are tilted with respected to an in-plane current direction. Alternatively, the non-symmetric device geometry may be produced by locating the magnetic pattern away from the center of a current injection line. The non-symmetric may permit switching absent application of an external magnetic field. A SO-STT device with non-symmetric device geometry, or another type of SO-STT device, may further integrate an additional semiconductor, insulator or metal layer into the device's multilayer stack. By integrating the additional semiconductor, insulator or metal layer, a significant reduction of SO-STT switching current density may be achieved. Depending on the embodiment, the additional semiconductor, insulator or metal layer may be disposed adjacent to the FM layer, or within the FM layer, among other possibilities.

12 Claims, 34 Drawing Sheets

(51) Int. Cl.
H01L 43/08 (2006.01)
H01L 27/22 (2006.01)

(58) Field of Classification Search
USPC .......................................................... 365/173
See application file for complete search history.

(56) References Cited

U.S. PATENT DOCUMENTS

| | | | |
|---|---|---|---|
| 9,608,039 B1* | 3/2017 | Apalkov | ............... H01L 27/228 |
| 2014/0015074 A1 | 1/2014 | Bedau et al. | |
| 2014/0056060 A1 | 2/2014 | Khvalkovskiy et al. | |
| 2014/0217528 A1 | 8/2014 | Whig et al. | |
| 2016/0225424 A1 | 8/2016 | Qiu et al. | |

OTHER PUBLICATIONS

Finnochio, et al., "Switching of a single ferromagnetic layer driven by spin Hall effect", Applied Physics Letter, May 30, 2013, vol. 102, May 30, 2013, pp. 212410-1 to 212420-5.

Guoqiang, Yu, et al., "Switching of perpendicular magnetization by spin-orbit torques in the absence of external magnetic fields", Nature Nanotechnology 9, 94 (2014), May 11, 2014, pp. 1-43.

Heinen, et al., "Current-induced domain wall motion in Co/Pt nanowires: separating spin torque and Oester-field effects", Applied Physics Letters, 2010, vol. 96, May 20, 2010, pp. 202510-1 to 02510-3.

Lavrijsen, et al., "Asymmetric pt/Co/Pt-stack induced sign-control of current-induced magnetic domain-wall creep", Applied Physics Letters, 2012, vol. 100, Jun. 28, 2012, pp. 262408-1 to 262408-5.

Loong, Li Min, et al., "Investigation and engineering spinorbit torques in heavy metal/CoFeAlSi/MgO thin film structure", Applied Physics Letters 107, 022405 (2015), Jul. 15, 2015, pp. 1-6.

Miron, et al., "Perpendicular switching of a single ferromagnetic layer induced by in-plane current injection", Nature, 2011, vol. 476, Aug. 11, 2011, pp. 189-193.

Qiu, Xuepeng et al., "Angular and temperature dependence of current induced spin-orbit effective fields in Ta/CoFeB/MgO nanowires", Scientific Reports 4, 4491 (2014), Mar. 27, 2014, pp. 1-6.

Qiu, Xuepeng et al., "Spin-orbit-torque engineering via oxygen manipulation", Nature Nanotechnology 10, 333 (2015), Mar. 2, 2015, pp. 333-338.

* cited by examiner

PRIOR ART

PRIOR ART

$h^z = 0.3$
$h^x = -1.1 \longrightarrow h^x = 1.1$
$h^z = -0.3$

| $P_{sw}$ | ↑ to ↓ | | ↓ to ↑ | |
|---|---|---|---|---|
| No shape anisotropy | 0.5 | 0.5 | 0.5 | 0.5 |
| | 0.5 | 0.5 | 0.5 | 0.5 |
| $\alpha = 0°$ | 0.5 | 0.5 | 0.5 | 0.5 |
| | 0.5 | 0.5 | 0.5 | 0.5 |
| $\alpha = 45°$ | 0.5 | 0 | 0.5 | 1 |
| | 0 | 0.5 | 1 | 0.5 |
| $\alpha = -45°$ | 0.5 | 1 | 0.5 | 0 |
| | 1 | 0.5 | 0 | 0.5 |

FIG. 3D

| α=-45° | x direction | | α=-45° | y direction | |
|---|---|---|---|---|---|
| Direction of current | +$J_e$ (→) | -$J_e$ (←) | Direction of current | +$J_e$ (→) | -$J_e$ (←) |
| Resulting shape anis. in plane | +x | -x | Resulting shape anis. in plane | +y | -y |
| Direction of switching | ↑ to ↓ | ↑ to ↓ | Direction of switching | ↓ to ↑ | ↓ to ↑ |
| α=45° | x direction | | α=45° | y direction | |
| Direction of current | +$J_e$ (→) | -$J_e$ (←) | Direction of current | +$J_e$ (→) | -$J_e$ (←) |
| Resulting shape anis. in plane | -x | +x | Resulting shape anis. in plane | -y | +y |
| Direction of switching | ↓ to ↑ | ↓ to ↑ | Direction of switching | ↑ to ↓ | ↑ to ↓ |

350

TECHNIQUES TO MODULATE SPIN ORBIT SPIN TRANSFER TORQUES FOR MAGNETIZATION MANIPULATION

RELATED APPLICATIONS

The present application claims priority to Singapore Patent Application No. 10201600175Y, titled Techniques to Modulate Spin Orbit Spin Transfer Torques for Magnetization Manipulation, filed Jan. 11, 2016 by Applicant National University of Singapore, the contents of which are incorporated by reference herein in their entirety.

BACKGROUND

Technical Field

The present disclosure relates generally to magnetization manipulation in spintronic devices, and more specifically to techniques for modulating spin orbit spin transfer torque (SO-STT) in spintronic devices.

Background Information

In modern spintronic devices, such as information storage devices (e.g., disks and random access memory), the magnetization directions of ferromagnets (FMs) are utilized to write, store and retrieve information. Effectively manipulating the magnetization direction, e.g. switching the magnetization direction via interactions between spins and charges, is important to the operation of such devices. Traditionally, magnetization manipulation has been achieved via current-induced spin transfer torque (STT) that requires a ferromagnetic spin polarizer in a spin valve or magnetic tunnel junction structure. More recently, techniques have been developed for magnetization manipulation that utilize spin-orbit spin transfer torque (SO-SOT). A typical SO-STT spintronic device (or simply SO-STT device) is structured as a multilayer stack including a ferromagnet (FM) layer adjacent to a metal layer (also referred to as an under or capping layer), among other layers. When a charge current flows through the SO-STT device, a spin current from the adjacent metal layer diffuses into the FM layer and influences the magnetization of the FM. The use of such an arrangement provides various advantages, for example, allowing for low power magnetization manipulation and fast motion of domain walls. In addition, a SO-STT technique allows for separate writing and reading current paths.

While SO-STT is a powerful technique for electrically manipulating magnetization in spintronic devices, there is a need for improved ways of modulating SO-STT. Traditionally, SO-STT devices have required an external magnetic field, referred to as a "symmetry breaking" external magnetic field, be applied to the device to be able to switch magnetization in a deterministic way. If this requirement could be eliminated, it would allow for greater simplification of the device's multilayer stack, which could simplify the fabrication process and/or improve device reliability. Likewise, traditional SO-STT devices have required higher than desired SO-STT switching current density. Improved techniques to enhance and modulate SO-STT magnitude are highly desired for low power spintronic devices (e.g., ultra low power magnetoresistive random-access memory (MRAM) devices) and/or high density magnetic storage devices.

SUMMARY

The need for a "symmetry breaking" external magnetic field may be avoided in a SO-STT device by implementing a non-symmetric device geometry. The non-symmetric device geometry may be produced by tilting a shaped magnetic pattern (e.g., an ellipse, diamond, rectangle, etc. shaped magnetic pattern) such that the pattern's main (long and short) axes are tilted with respected to an in-plane current direction, which may create triaxial anisotropy. The second anisotropy (additional to traditional perpendicular magnetic anisotropy) may replace the external magnetic field to provide deterministic SO-STT switching. Alternatively, the non-symmetric device geometry may be produced by locating the magnetic pattern away from the center of a current injection line. A SO-STT device that uses a non-symmetric device geometry, or another type of SO-STT device, may be further improved by integrating an additional semiconductor, insulator or metal layer into the device's multilayer stack for giant modulation of SO-STT. By integrating an additional semiconductor, insulator or metal layer, a significant reduction of SO-STT switching current density may be achieved. Depending on the embodiment, the additional semiconductor, insulator or metal layer may be disposed adjacent to the FM layer, or within the FM layer, among other possibilities.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which:

FIG. 3C is a table depicting switching probabilities $P_{SW}$ for different tilted ellipse-shaped device geometries;

FIG. 3D is a table summarizing switching direction for one particular tilted ellipse-shaped device geometry (α=45°), for varied current injection directions (±x or ±y) and current polarity sign of $J_e$;

DETAILED DESCRIPTION OF EXAMPLE EMBODIMENTS

A SO-STT device may use a non-symmetric device geometry. The non-symmetric device geometry may be produced by tilting a shaped magnetic pattern (e.g., an ellipse, diamond, rectangle, etc. shaped magnetic pattern), such that the pattern's main (long and short) axes are tilted with respected to an in-plane current direction, to create triaxial anisotropy. The second anisotropy (additional to traditional perpendicular magnetic anisotropy) may replace the "symmetry breaking" external magnetic field to provide deterministic SO-STT switching. Alternatively, non-symmetric device geometry may be produced by locating the magnetic pattern away from the center of a current injection line. Such a device may permit a high-degree of control of the magnetization direction in the FM layer with the use of currents only.

Figure 1A:
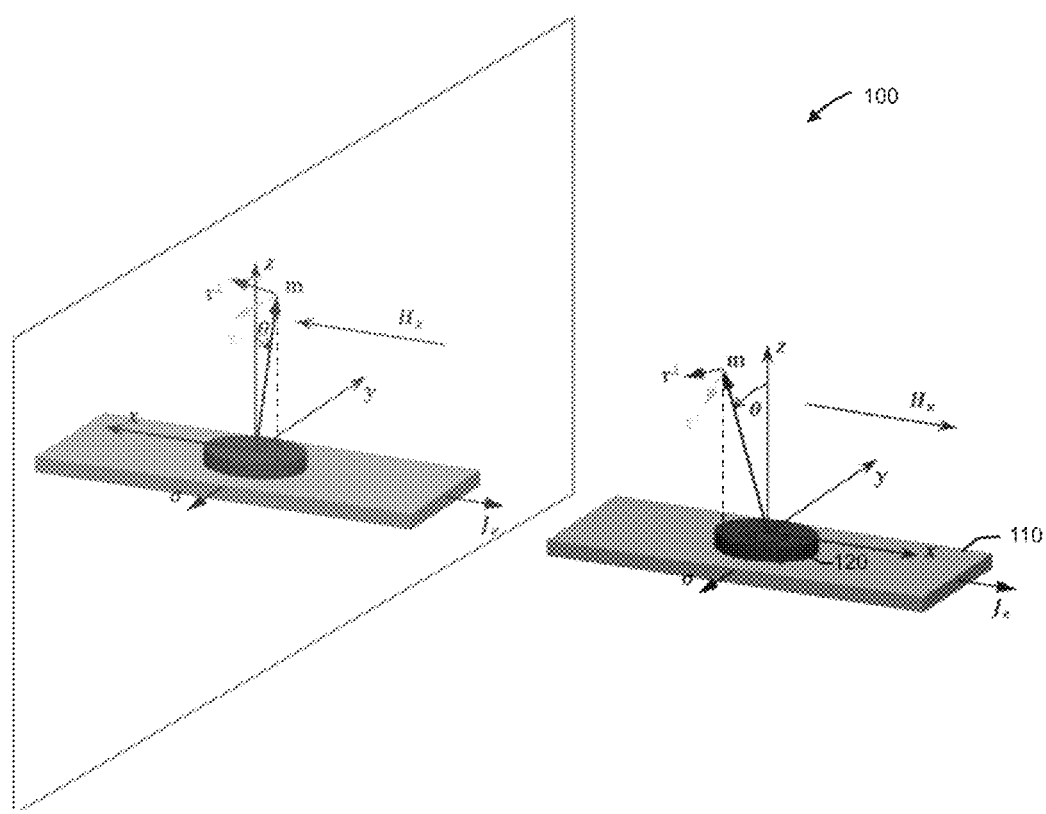
FIG. 1A is a schematic diagram of a traditional SO-STT device geometry having a current track ($J_e$), and a FM pattern with uniaxial perpendicular anisotropy, with a mirrored image to the left.

FIG. 1 is a schematic diagram 100 of a traditional SO-STT device geometry having a current track ($J_e$) 110, and a FM pattern 120 with uniaxial perpendicular anisotropy 120, with a mirrored image to the left. Traditionally a "symmetry breaking" external magnetic field has been used to break the symmetry of such a device with respect to the (Oxz) or (Oyz) planes, where x refers to the applied charge current direction, y is the orthogonal direction in the plane of the layers, and z is the direction perpendicular to the layers of the device's multilayer stack. As can be seen from the mirrored image by the symmetry of plane (Oyz), the system is not equivalent to itself upon symmetry (the "symmetry breaking" external field $H_x$ is reversed), which allows the deterministic switching of the magnetization vector, e.g., from a vertical "up" direction to the opposite "down" direction.

Figure 1B:
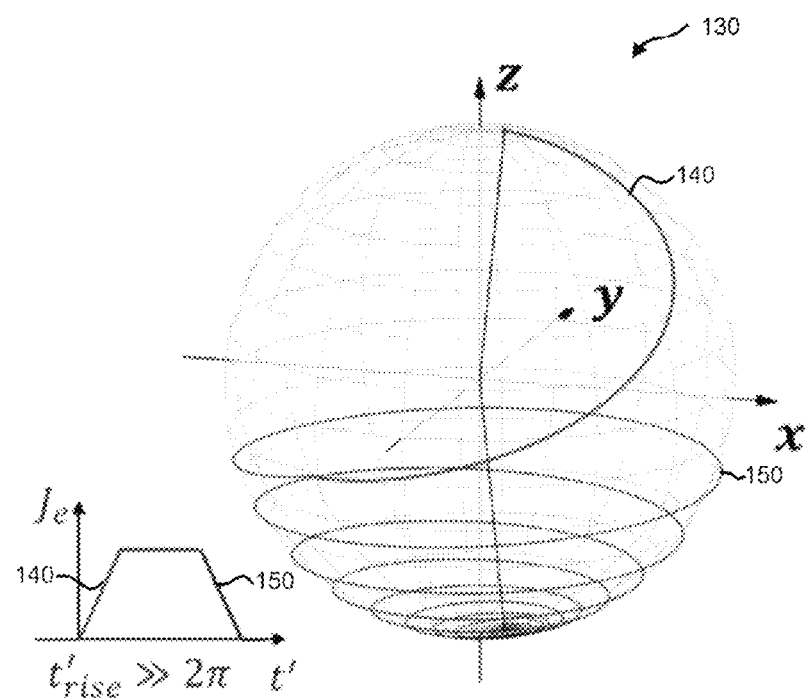
FIG. 1B is a diagram of a traditional SO-STT device switching trajectory of the magnetization vector m under a combination of magnetic field and current pulse in the same direction.

FIG. 1B is a diagram 130 of a traditional SO-STT device switching trajectory of the magnetization vector m under a combination of magnetic field and current pulse in the same direction. A first part 140 corresponds to the trajectory while the current is applied, and a second part 150 corresponds to the subsequent relaxation after the current pulse was sent. As shown, switching is effective since the initial position is "up", pointing towards +z, whereas the final position is "down", pointing towards −z.

As discussed in the Background above, the need for a "symmetry breaking" external field poses various problems, such as complicating the fabrication process. In one embodiment, the need for an external field is avoided by implementing a non-symmetric device geometry in a SO-STT device, either by tilting a shaped magnetic pattern (e.g., an ellipse, diamond, rectangle, etc. shaped magnetic pattern) or locating the magnetic pattern away from the center of a current injection line.

Figure 2A:
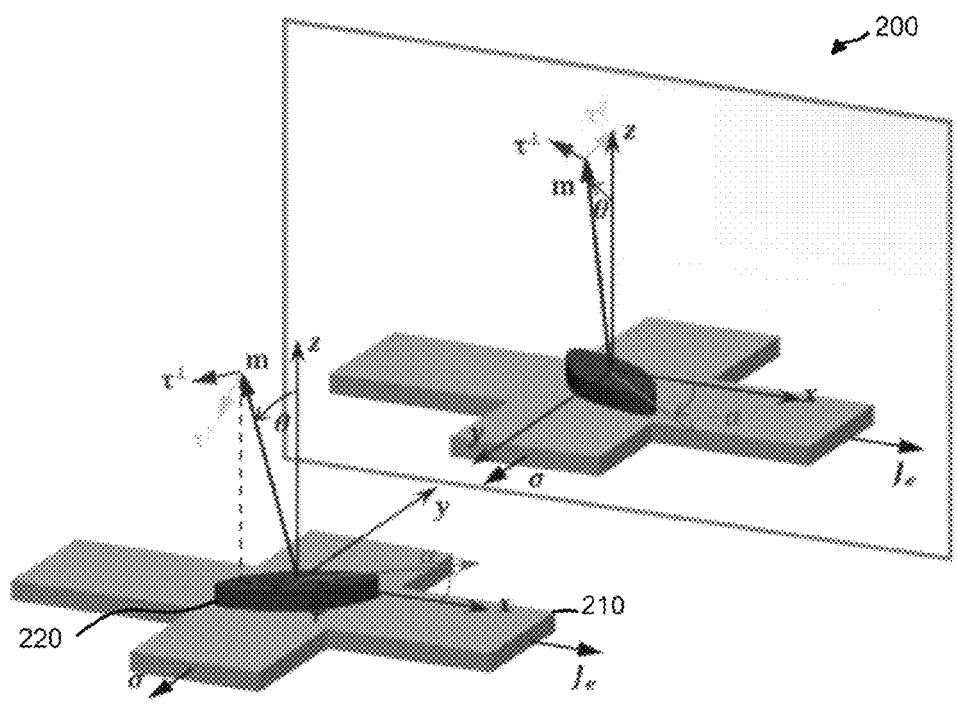
FIG. 2A is a schematic diagram of a tilted ellipse-shaped device geometry, having a current track ($J_e$), and a FM pattern that combines perpendicular magnetic anisotropy and in-plane shape anisotropy, with a mirror image in the background.

FIG. 2A is a schematic diagram 200 of a tilted ellipse-shaped device geometry, having a current track ($J_e$) 210, and a FM pattern 220 that combines perpendicular magnetic anisotropy and in-plane shape anisotropy, with a mirror image in the background. A shape anisotropy is added to the perpendicular magnetic anisotropy and has a long axis that is tilted with respect to the x-direction (current direction). The angle α between the long axis of the ellipse and the current may be, for example, between 0 and 90 degrees. Both anisotropies combine into a triaxial anisotropy. As can be seen from the mirrored image by the symmetry of plane (Oxz) behind the device in the foreground, the system is not equivalent to itself upon symmetry due to the tilting of the main axis. This symmetry breaking allows deterministic switching to be effectively allowed.

Figure 2B:
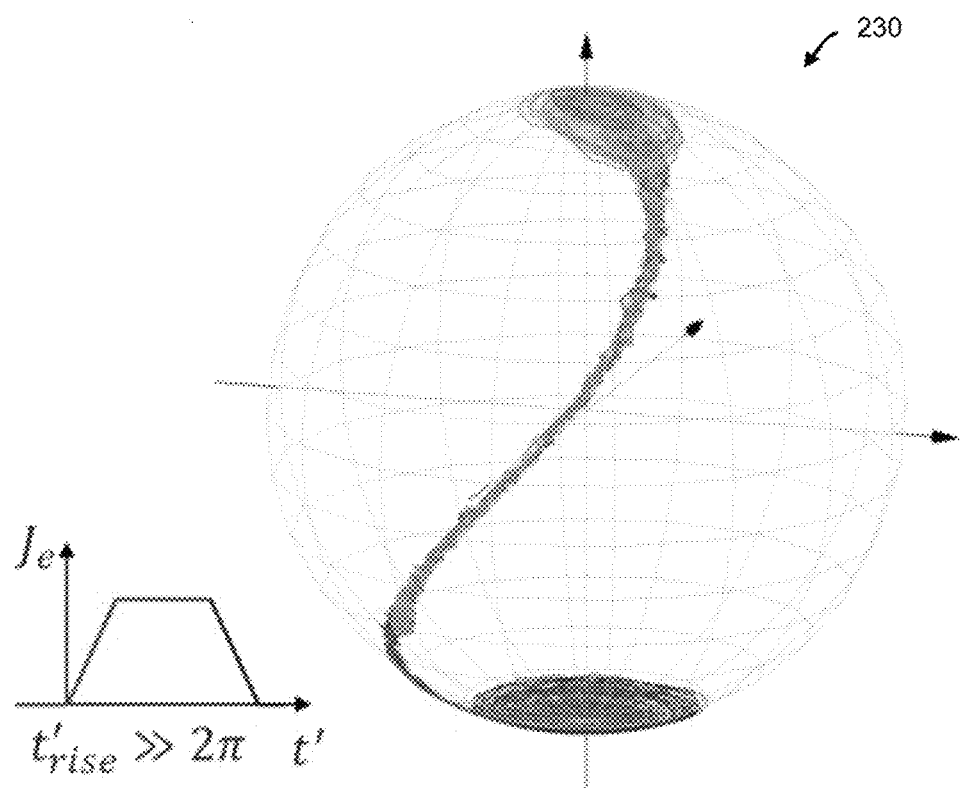
FIG. 2B is a diagram of a SO-STT switching trajectories in a SO-STT device that uses a tilted ellipse-shaped device geometry to create triaxial anisotropy. In this example, the trajectories are simulated at a finite temperature (T=300 K)

FIG. 2B is a diagram 230 of SO-STT switching trajectories in a SO-STT device that uses a tilted ellipse-shaped device geometry to create triaxial anisotropy. In this example, the trajectories are simulated at finite temperature (T=300 K). The deterministic, reliable switching is achieved due to the second anisotropy axis that influences the trajectory as a "symmetry breaking" external magnetic field would do while m crosses the plane. As a consequence, switching may be achieved without any external magnetic field. This effect is a universal, geometry-originated effect that may be effective for a wide variety of materials used in fabrication of the layers of the device's multilayer stack.

In a traditional SO-STT switching scheme, the switching direction, i.e., whether m experiences a transition from "up" to "down" magnetization states or from "down" to "up" magnetization states, is determined by the relative directions of the current $J_e$ and of the external magnetic field $H_{ext}$. In the present scheme, where triaxial anisotropy allows deterministic switching, the direction of switching may be determined only by the sign of the rotation angle between the main axis of the ellipse and the current direction. This angle is denoted by α in FIG. 2A. For a current applied along ±x of any polarity (the angle α being definitely determined by the patterning of the device during fabrication) one direction of transition may be achieved, either "up" to "down" or "down" to "up". To obtain a fully functional SO-STT device, capable of switching back and forth between two stables states, a second track of current injection may be used, where the second track is at a non-zero angle (e.g., orthogonal) to the first one.

Figure 3A:
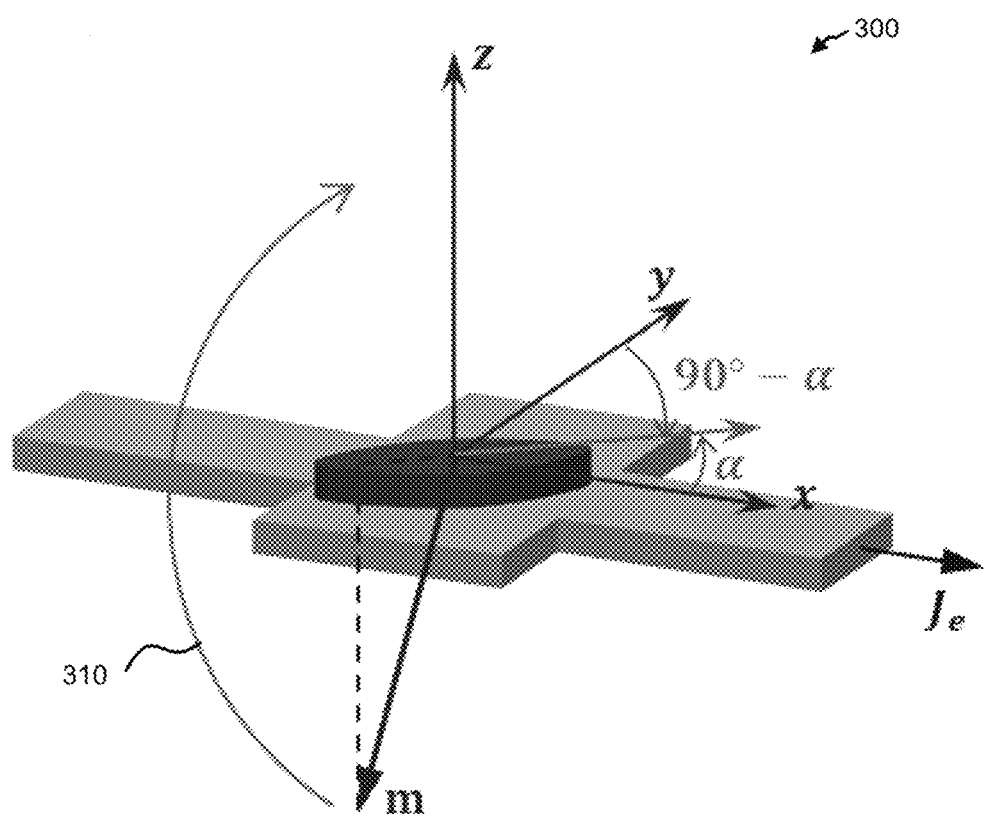
FIG. 3A is a diagram illustrating a first track of current injection along ±x in a SO-STT device that uses a tilted ellipse-shaped device geometry.

FIG. 3A is a diagram 300 illustrating a first track of current injection along ±x in a SO-STT device that uses a tilted ellipse-shaped device geometry. The direction of the magnetization switching 310 is "down" to "up", as a consequence of α>0.

Figure 3B:
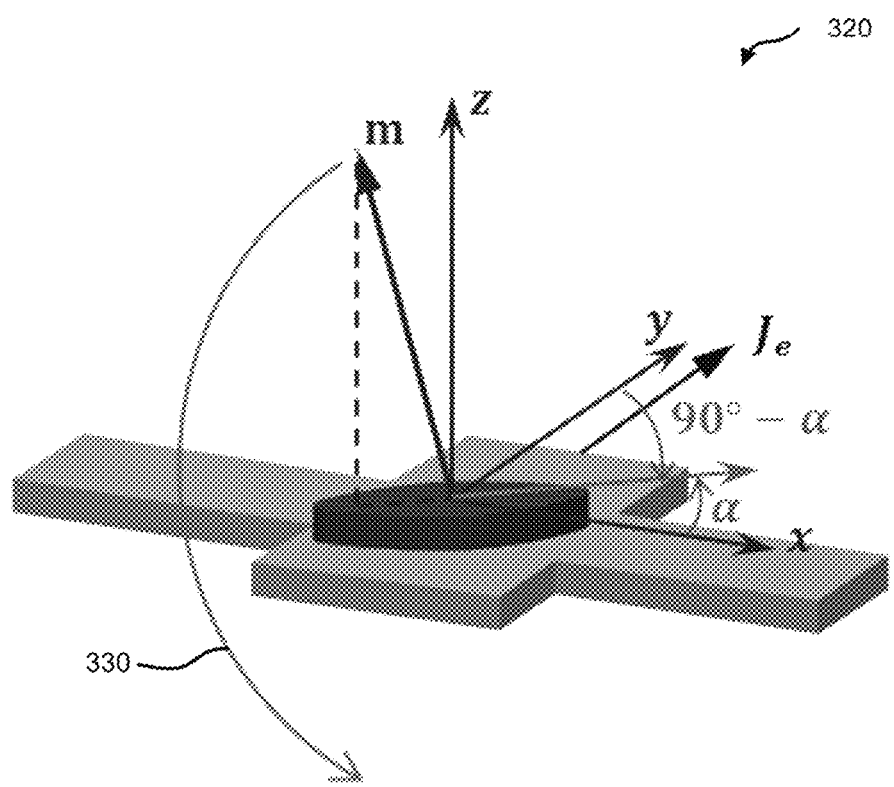
FIG. 3B is a diagram illustrating a second track of current injection along +y in the same device as FIG. 3A with α>0.

FIG. 3B is a diagram 320 illustrating a second track of current injection along ±y in the same device as FIG. 3A with α>0. The angle between the current flowing along ±y and the main axis is now the opposite of the complementary angle of α, whose value is α−90°. The direction of magnetization switching 330 is then reversed, from "up" to "down". As can be seen by FIGS. 3A and 3B, by alternating the $J_e$ current direction, along ±x (FIG. 3A) or ±y (FIG. 3B) depending on whether the "up" to "down" or "down" to "up" switching event is required, toggle switching can be achieved.

A SO-STT device (e.g., a 4-terminal device), made of the two current injection lines disposed at a non-zero angle with respect to each other (e.g., orthogonal current injection lines) and an ellipse-shaped magnetic pattern in the central part of the cross, allows for writing "up" or "down" magnetization states with current pulses as well as reading through anomalous Hall resistance or magnetic tunnel junction structures on top of the FM layer. Spin orbit torques may be described in terms of Slonczewski and fieldlike terms. The reliability of the switching may depend on the relative signs of the Slonczewski and fieldlike torque coefficients. The Slonczewski and fieldlike torques, represented, respectively, by the vectors $\tau^\perp$ and $\tau^\parallel$ in FIGS. 1A and 2A, correspond both to positive coefficients. Torques contribute to deterministic switching if the fieldlike torque and Slonczewski torque coefficients share the same sign, and prevent it if they have opposite signs.

FIG. 3C is a table 340 depicting switching probabilities $P_{SW}$ for different tilted ellipse-shaped device geometries. In each geometry, for each direction of switching, four values are given corresponding to the different torque coefficients as indicated by the legend at the top of the table: top/bottom values correspond to positive/negative Slonczewski torque coefficients and left/right values correspond to positive/negative coefficients of the fieldlike torque. Where either $P_{SW}=0$ or $P_{SW}=1$ deterministic switching is possible.

The deterministic behavior (for torques coefficients of same sign) can be explained by the effective direction of the shape anisotropy that interacts with the torques when m reaches the plane. The shape anisotropy by itself does not induce a preference for m being along one of the two opposite directions along the main axis (for instance, if α=0°, +x and −x are equally favored, so that relaxation to +z and −z are also equally favored) and would not lead to deterministic switching. However, when the axis is tilted, one of the direction along the main axis is closer to the direction of m when it crosses the plane. For example, for $J_x>0$, α=−45° and positive torques coefficients, m crosses the (Oxy) plane near −y. Because α=−45°, two directions of m in the plane are preferred by the shape anisotropy along the main axis of the ellipse, namely, x−y and −x+y. As −y is closer to x−y than to −x+y, the first one is preferred over the second. This implies that the shape anisotropy displaces m (initially near −y) towards x−y, so that the effective anisotropy field is along +x. The relaxation of m will, therefore, deterministically lead to −z, ensuring deterministic "up" to "down" switching in this case. The trajectory in this case is exemplified in FIG. 2B.

FIG. 3D is a table 350 summarizing switching direction for one particular tilted ellipse-shaped device geometry (α=45°), for varied current injection directions (±x or ±y) and current polarity sign of $J_e$. The coefficients of torques are assumed positive.

To recap, a SO-STT device (e.g., a 4-terminal device) made of the two current injection lines disposed at a non-zero angle with respect to each other (e.g., orthogonal current injection lines) and an ellipse-shaped magnetic pattern showing perpendicular magnetic anisotropy, located in the central part of the cross, allows writing the magnetic states with current pulses with no requirement for an external assist field. The device provides deterministic switching for the proper directions of the torques.

The above discussed non-symmetric (e.g., tilted ellipse, diamond, rectangle, etc. shaped or non-centered)SO-STT device may be further improved by integrating an additional semiconductor, insulator or metal into the device's multilayer stack for giant modulation of the SO-STT. By integrating an additional semiconductor, insulator or metal, a significant reduction of SO-STT switching current density may be achieved. Depending on the embodiment, the additional semiconductor, insulator or metal layer may be disposed adjacent to the ferromagnet, or within the ferromagnet, among other possibilities.

Additional Semiconductor, Insulator or Metal Layer Adjacent to FM Layer

Figure 4A:
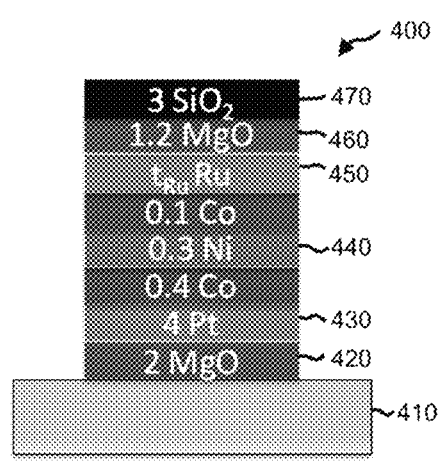
FIG. 4A is a schematic diagram of an example multilayer stack that includes an additional metal layer adjacent to a FM layer.

In a first example embodiment, the additional semiconductor, insulator, or metal layer is disposed adjacent to the FM layer to modulate the SO-STT acting on the FM. FIG. 4A is a schematic diagram 400 of an example multilayer stack that includes an additional metal layer adjacent to a FM layer. The multilayer stack 400 includes, in order, a substrate 410, first spacer layer 420 (e.g., 2 nm of Magnesium Oxide (MgO)), a semiconductor, insulator, or metal layer 430 (e.g., 4 nm of Platinum (Pt)), a FM layer 440 (e.g., a Co—Ni—Co tri-layer of 0.4 nm Co, 0.3 nm Ni, and 0.1 nm Co), an additional semiconductor, insulator, or metal layer 450, a second spacer layer 460 (e.g., 1.2 nm of MgO), and a capping layer 470 (e.g., 3 nm of Silicon Oxide ($SiO_2$)). In one implementation of FIG. 4A where the additional semiconductor, insulator or metal layer 430 is an additional metal layer, the additional metal layer may be constructed of Ru and have a thicknesses ($t_{Ru}$) which is varied from 0 to 3.2 nm. Combined with all the layers, the FM may have perpendicular magnetic anisotropy with magnetization predominantly oriented perpendicular to the plane of the device layer.

Figure 4B:
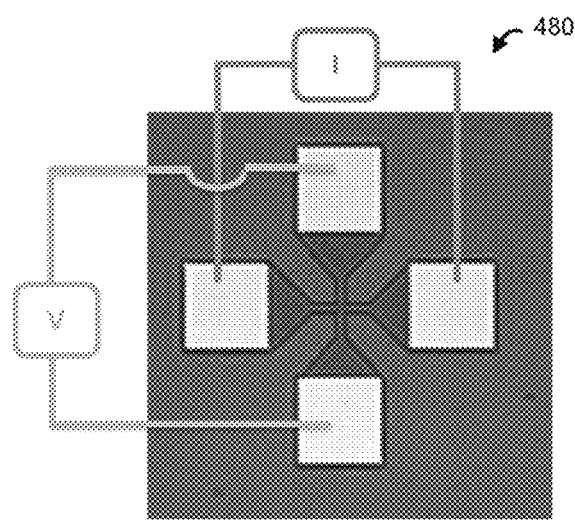
FIG. 4B is a microscopy image of an example patterned device produced from the layers of FIG. 4A having an example Hall bar cross structure (e.g., with 10 μm width)

The layers of FIG. 4A may be patterned into a SO-STT device. FIG. 4B is a microscopy image of an example patterned device 480 produced from the layers of FIG. 4A having an example Hall bar cross structure (e.g., with 10 μm width). To test the magnetic and electric properties of devices with different thicknesses of the additional layer, anomalous Hall loops ($R_H$=V/I as defined in of FIG. 4B) may be measured by sweeping a magnetic field perpendicular to the layer plane direction.

Figure 5A:
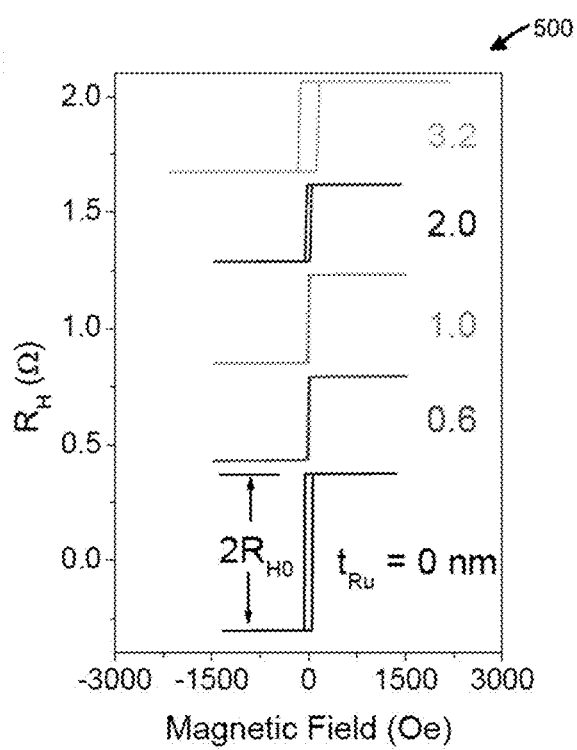
FIG. 5A is a graph of example anomalous Hall resistance ($R_H$) versus magnetic field for example devices with different values of $t_{Ru}$ produced according the example arrangements of FIGS. 4A and 4B.

FIG. 5A is a graph 500 of example anomalous Hall resistance ($R_H$) versus magnetic field for example devices with different values of $t_{Ru}$ produced according to the example arrangements of FIGS. 4A and 4B. The $R_H$ of devices having different values of $t_{Ru}$ is shifted vertically along the y-axis. Rectangular magnetic hysteresis loops are observed, verifying good perpendicular magnetic anisotropy of all the devices with different $t_{Ru}$.

Figure 5B:
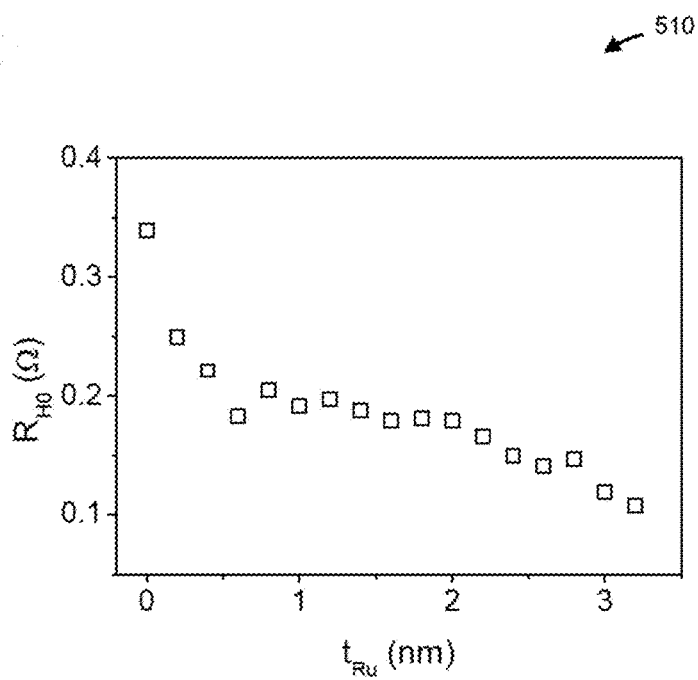
FIG. 5B is a graph summarizing anomalous Hall resistance for the example devices of FIG. 5A, depicting $R_{H0}$ versus $t_{Ru}$, where $R_{H0}$ is defined in FIG. 5A.

FIG. 5B is a graph 510 summarizing anomalous Hall resistance for the example devices of FIG. 5A, depicting $R_{H0}$ versus $t_{Ru}$, where $R_{H0}$ is defined in FIG. 5A.

Figure 6A:
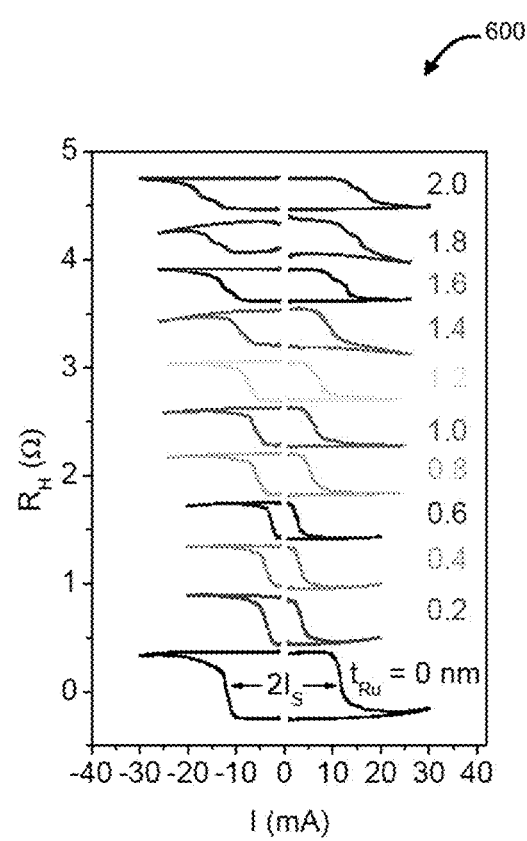
FIG. 6A and FIG. 6B are graphs that show anomalous Hall resistance versus in-plane current (I) magnetization switching driven by SO-STT, for each of the example devices produced according to FIGS. 4A and 4B.
Figure 6B:
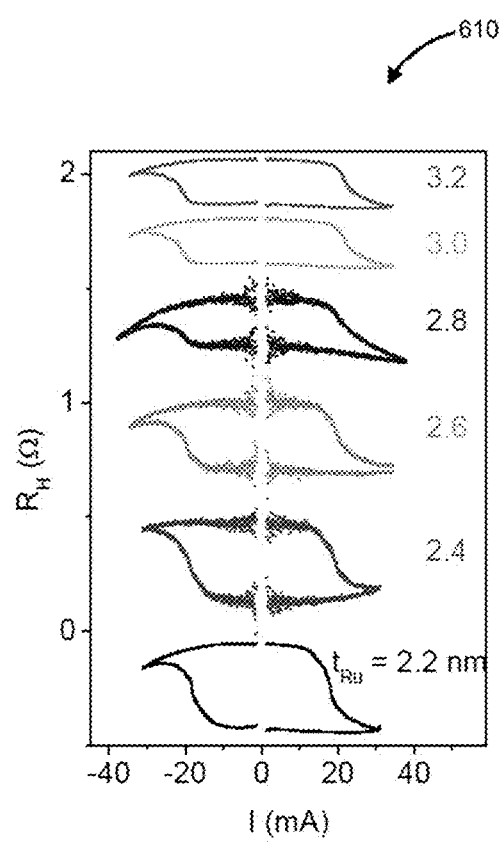

FIG. 6A and FIG. 6B are graphs 600, 610 that show anomalous Hall resistance versus in-plane current (I) magnetization switching driven by SO-STT, for each of the example devices produced according to FIGS. 4A and 4B. In addition to the current, a constant external magnetic field of 1000 Oe is applied along the current direction to break the symmetry of the device, and allows for selective magnetization switching by the in-plane current. It should be understood the external magnetic field is simply used here for testing purposes, and when used in conjunction with the above discussed techniques for non-symmetric SO-STT (e.g., tilted ellipse, rectangle, diamond, etc. shaped or non-centered magnetic patterns), an external magnetic field may not be needed. Since $R_H$ probes the average z-component of the FM magnetization, the hysteretic switching of $R_H$ demonstrates that the current induced spin-orbit torque indeed switches the magnetization. As can be seen, the current required for the magnetization switching (Is) changes significantly with $t_{Ru}$. With the example devices, the minimal switching current may be achieved with 0.6 nm Ru.

Figure 6C:
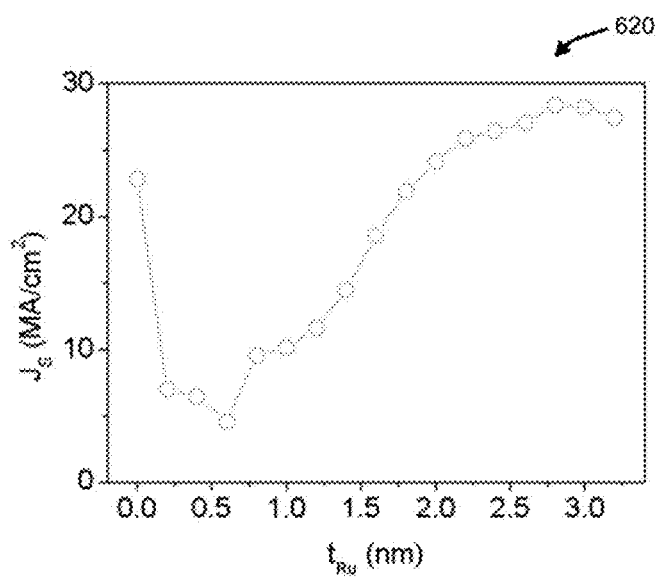
FIG. 6C is a graph showing example switching current density ($J_S$) dependence on Ru thickness based on the example devices produced according to FIGS. 4A and 4B.

FIG. 6C is a graph 620 showing example switching current density ($J_S$) dependence on Ru thickness based on the example devices produced according to FIGS. 4A and 4B. $J_S$ is the current density flowing through the device with the application of Is. More than 6 times modulation of $J_S$ is obtained by changing the Ru thickness.

Figure 6D:
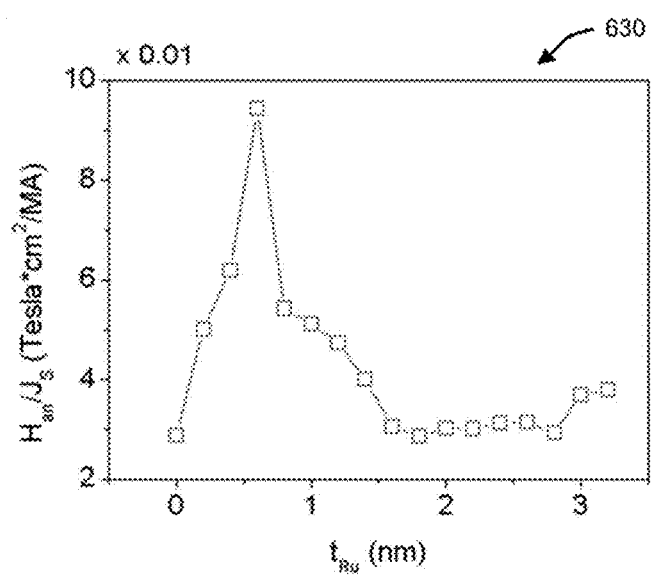
FIG. 6D is a graph showing example SO-STT driven magnetization switching efficiency ($H_{an}/J_S$) versus Ru thickness based on the example devices produced according to FIGS. 4A and 4B.

FIG. 6D is a graph 630 showing example SO-STT driven magnetization switching efficiency versus Ru thickness based on the example devices produced according to FIGS. 4A and 4B. The SO-STT driven switching efficiency is defined by $\eta=H_{an}/J_S$, where $H_{an}$ is the perpendicular anisotropy field of the device, and η is proportional to the magnitude of SO-STT. $J_S$ is the magnetization switching current density. A giant modulation of η, more than 3 times, is demonstrated in this example.

Additional Semiconductor, Insulator or Metal Layer within the FM Layer

In a second example embodiment, the additional semiconductor, insulator or metal layer is inserted between two FM layers in the multilayer stack. In an implementation where the additional semiconductor, insulator or metal layer is an additional metal layer, the additional metal layer may be Ru, and form a structure known as a synthetic antiferromagnet (SyAF) structure. The magnetization directions of the FM1 and FM2 layers may be strongly coupled through Ru, which orients antiparallel or parallel to each other depending on the thickness of Ru. SyAF has the advantages of high thermal stability, small net magnetic moment, and producing a negligible fringing magnetic field.

Figure 7A:
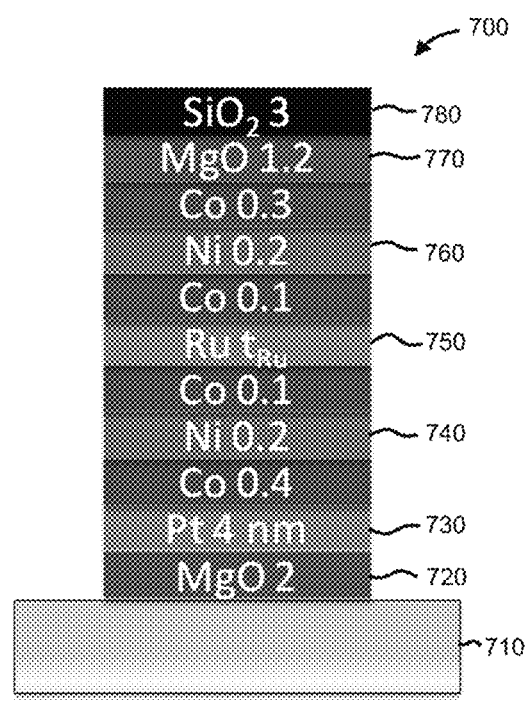
FIG. 7A is a schematic diagram of an example multilayer stack that includes an additional metal layer inserted between two FM layers.

FIG. 7A is a schematic diagram of an example multilayer stack 700 that includes an additional metal layer inserted between two FM layers. The multilayer stack 700 includes, in order, a substrate 710, first spacer layer 720 (e.g., 2 nm of MgO), a semiconductor, insulator, or metal layer 730 (e.g., 4 nm of Pt), a first FM layer 740 (e.g., a Co—Ni—Co tri-layer of 0.4 nm Co, 0.2 nm Ni, and 0.1 nm Co), an additional semiconductor, insulator, or metal layer 750, a second FM layer 760 (e.g., a Co—Ni—Co tri-layer of 0.1 nm Co, 0.2 nm Ni, and 0.3 nm Co), a second spacer layer 770 (e.g., 1.2 nm of MgO), and a capping layer 780 (e.g., 3 nm of Silicon Oxide ($SiO_2$)). The whole multilayer stack has perpendicular anisotropy. In one implementation of FIG. 7A, where the additional semiconductor, insulator or metal layer 750 is an additional metal layer, the additional metal layer may be constructed of Ru. The SyAF coupling strength may be modulated by the Ru thickness, $t_{Ru}$.

Figure 7B:
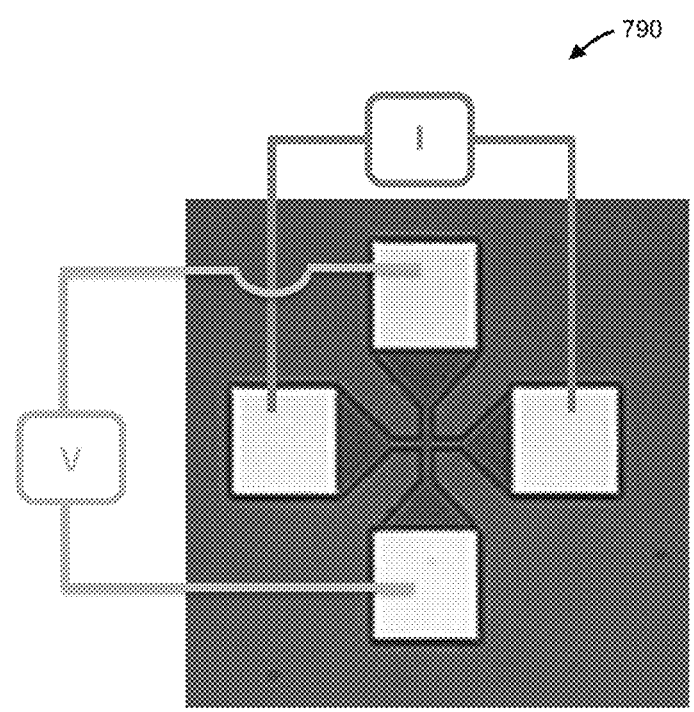
FIG. 7B is a microscopy image of an example patterned device produced from the layers of FIG. 7A having an example Hall bar cross structure.

FIG. 7B is a microscopy image of an example patterned device 790 produced from the layers of FIG. 7A having an example Hall bar cross structure.

Figure 8A:
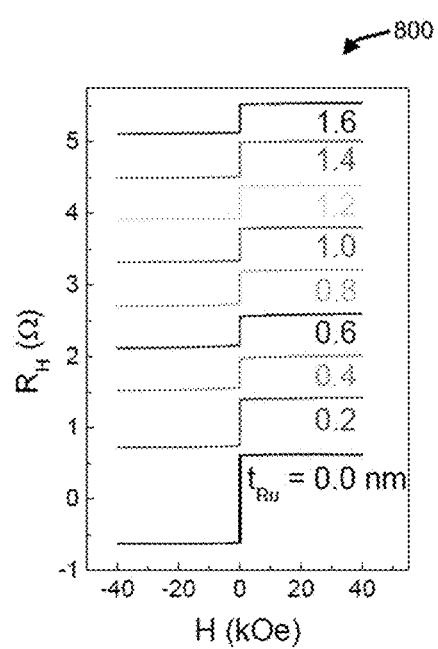
FIG. 8A is a graph of example anomalous Hall resistance ($R_H$) versus magnetic field according to the example arrangements of FIGS. 7A and 7B.

FIG. 8A is a graph 800 of example anomalous Hall resistance ($R_H$) versus magnetic field. The magnetic field is applied perpendicular to the layer plane. The $R_H$ of devices having different values of $t_{Ru}$ is shifted vertically along the y-axis. Well-defined perpendicular anisotropy of the multilayers is shown by the anomalous Hall effect measurements.

Figure 8B:
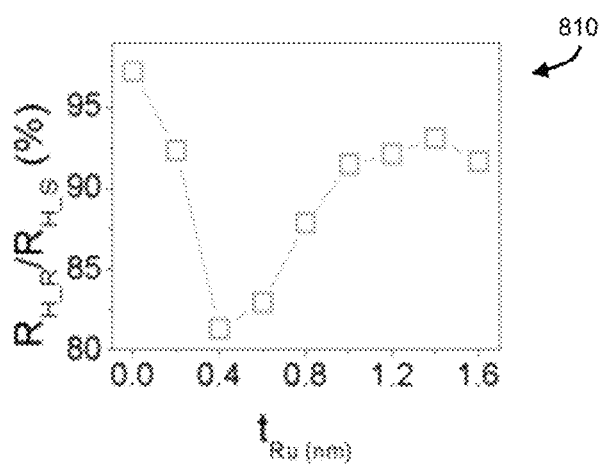
FIG. 8B is a graph of remanence anomalous Hall resistance ($R_{H\_R}$) divided by saturation anomalous Hall resistance ($R_{H\_S}$) versus $t_{Ru}$ for the example devices with different values of $t_{Ru}$ produced according to the example arrangements of FIGS. 7A and 7B.

FIG. 8B is a graph 810 of remanence anomalous Hall resistance ($R_{H\_R}$) divided by saturation anomalous Hall resistance ($R_{H\_S}$) versus $t_{Ru}$ for the example devices with different values of $t_{Ru}$ produced according to the example arrangements of FIGS. 7A and 7B. $R_{H\_S}$ is extracted from FIG. 8A and taken as $R_{H\_S}=R_H$ (40 kOe)-$R_H$ (−40 kOe). $R_{H\_R}$ also extracted from FIG. 8A and defined as the hysteresis difference of $R_H$ at zero magnetic field. As can be seen, $R_{H\_R}/R_{H\_S}$ shows a non-monotonic change with Ru thickness. In this example, the minimum value of $R_{H\_R}/R_{H\_S}$ is observed for the sample with $t_{Ru}$=0.4 nm, which indicates the maximum SyAF coupling strength.

Figure 8C:
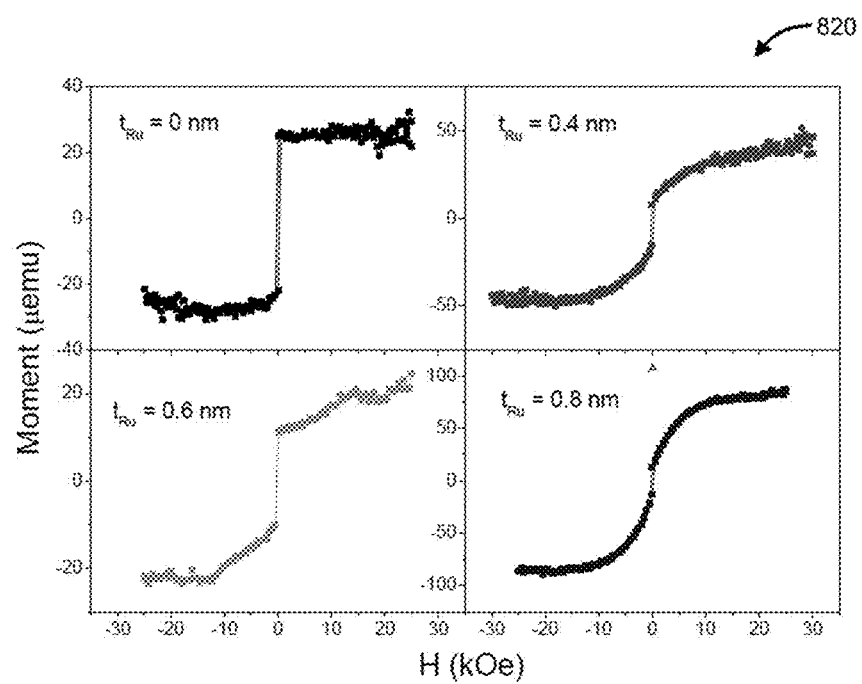
FIG. 8C is a graph of magnetic moment versus magnetic field measured by vibrating sample magnetometer (VSM) for example devices with different values of $t_{Ru}$ produced according the example arrangements of FIGS. 7A and 7B.

FIG. 8C is a graph 820 of magnetic moment versus magnetic field measured by vibrating sample magnetometer (VSM) for example devices with different values of $t_{Ru}$ produced according the example arrangements of FIGS. 7A and 7B. The magnetic field is applied perpendicular to the layer plane. As can be seen in the magnetic hysteresis loops, typical SyAF features are observed. For the samples with 0.4, 0.6, and 0.8 nm Ru, a large magnetic field (~10 kOe) is required to saturate the magnetic moment along the magnetic field direction.

Figure 9A:
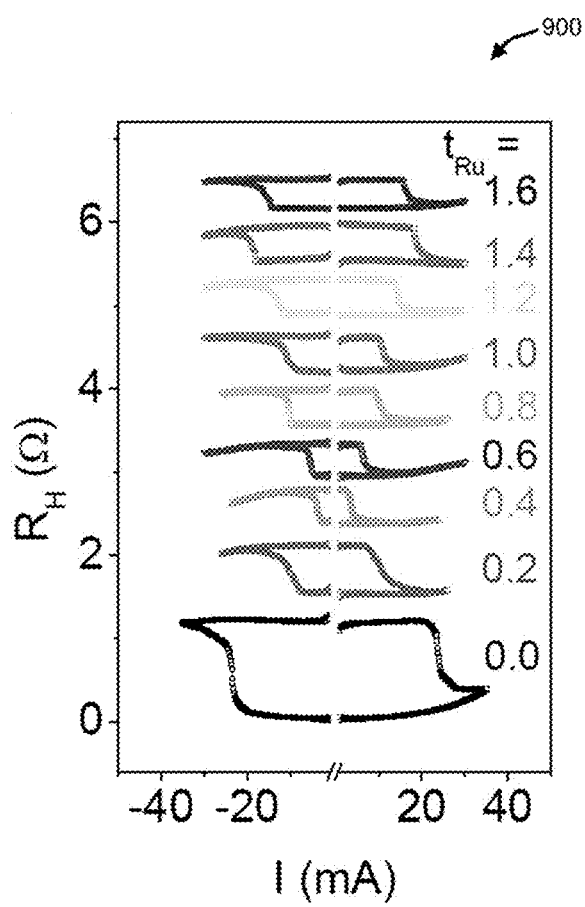
FIG. 9A is a graph that show anomalous Hall resistance versus in-plane current (I) for each of the example devices produced according to FIGS. 7A and 7B.

FIG. 9A is a graph 900 that shows the anomalous Hall resistance versus in-plane current (I) for each of the example devices produced according to FIGS. 7A and 7B. In this particular example, in addition to the current, a constant external magnetic field of 1000 Oe is applied along the current direction. However, it should be understood that the external magnetic field is applied here simply for testing purposes, and when used in conjunction with the above discussed techniques for non-symmetric SO-STT, an external magnetic field may not be needed. As can be seen, the switching current is significantly modulated by the Ru thickness.

Figure 9B:
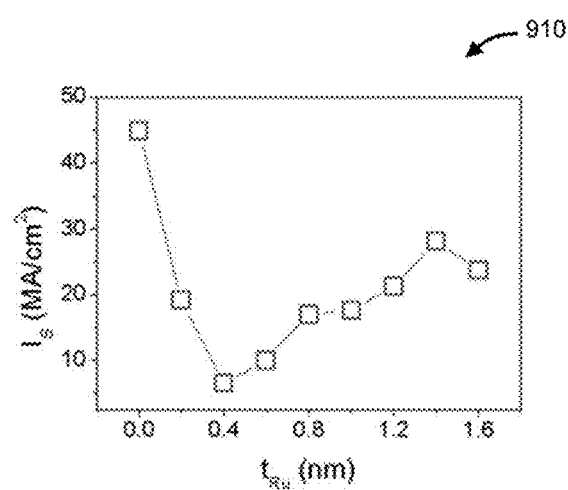
FIG. 9B is a graph showing example switching current density ($I_S$) dependence on Ru thickness, based on the example devices produced according to FIGS. 7A and 7B.

FIG. 9B is a graph 910 showing example switching current density ($I_S$) dependence on Ru thickness, based on the example devices produced according to FIGS. 7A and 7B. In this example, the smallest switching current ($I_S$) is observed for the device with the strongest SyAF coupling strength ($t_{Ru}$=0.4 nm), and is ~7 times smaller compared to the device with $t_{Ru}$=0 nm.

Figure 9C:
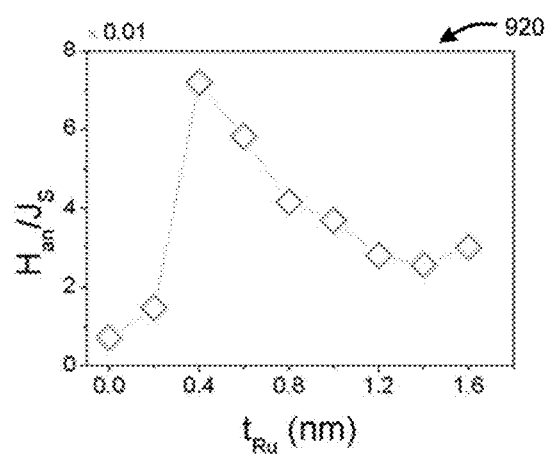
FIG. 9C is a graph showing example magnetization switching efficiency ($\eta = H_{an}/J_S$) versus Ru thickness, based on the example devices produced according to FIGS. 7A and 7B.

FIG. 9C is a graph 920 showing example magnetization switching efficiency ($\eta = H_{an}/J_S$) versus Ru thickness, based on the example devices produced according to FIGS. 7A and 7B. $H_{an}$ is the device perpendicular anisotropy and $J_S$ is the magnetization switching current density. In this example, a giant modulation in η of approximately 10 times is achieved.

In order to quantify the current induced spin-orbit effective fields, anomalous Hall loops may be measured using a harmonic technique. A sinusoidal AC current $I_{ac}$ with an amplitude of 3.5 mA and a frequency of 13.7 Hz may applied to the devices, and the first ($V_{f,//}$ or $V_{f,\perp}$, while the // or ⊥ denote the signal measured at a longitudinal or transverse scheme, respectively) and second harmonic signals may be measured simultaneously by two lock-in amplifiers.

Figure 10A:
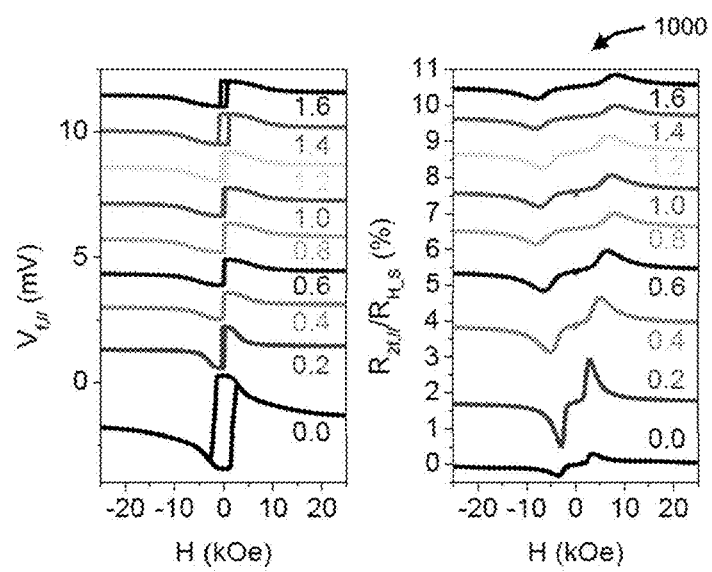
FIG. 10A is a graph showing first and second harmonic hall loops under a longitudinal scheme.
Figure 10B:
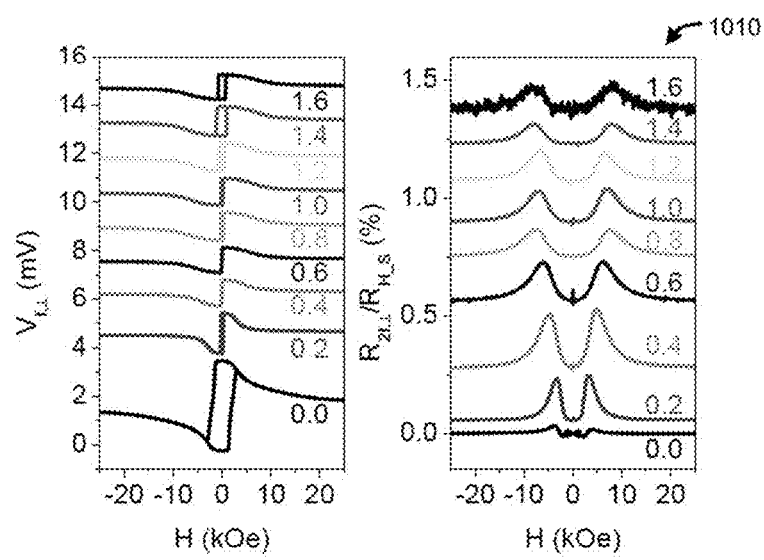
FIG. 10B is a graph showing first and second harmonic hall loops under a transverse scheme.

FIG. 10A is a graph 1000 showing first and second harmonic hall loops under a longitudinal scheme. FIG. 10B is a graph 1010 showing first and second harmonic hall loops under a transverse scheme. In this example, an external magnetic field may be applied with a small tilting angle ($\theta_H$=4°) to the layer plane. As can be seen from FIGS. 10A and 10B, changes in harmonic Hall signals may be observed for the devices with different Ru thicknesses.

Figure 10C:
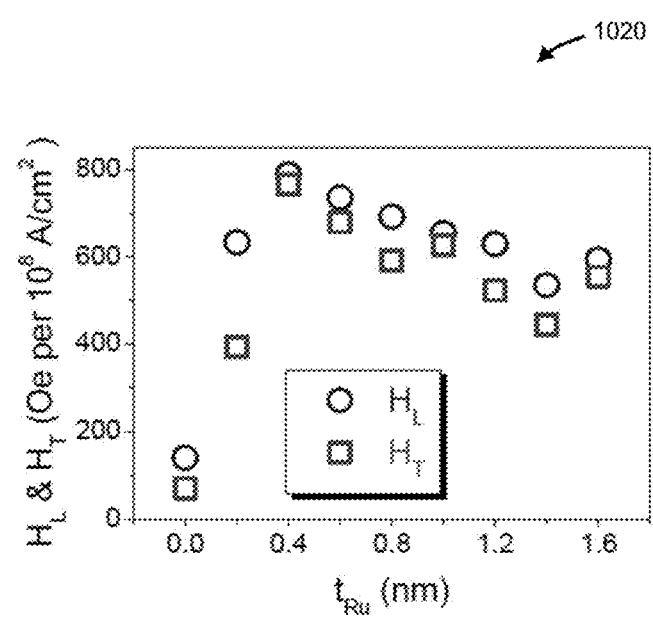
FIG. 10C is a graph showing current induced effective field ($H_L$ and $H_T$) as a function of Ru thickness.

From the harmonic measurements data, the longitudinal and transverse SOT effective field components, $H_L$ and $H_T$, may be extracted. FIG. 10C is a graph 1020 showing current induced effective field ($H_L$ and $H_T$) as a function of Ru thickness. $H_L$ and $H_T$ may be modulated up to 5.2 and 10 times, respectively, by changing the Ru thickness in the structure.

Alternative Materials

It should be understood that an additional semiconductor, insulator or metal layer may be integrated into the multilayer stack (adjacent to an FM layer, or within the FM Layer) that uses a variety of materials other than the specific examples provided above. For example, it should be understood that a device's multilayer stack is not restricted to Co—Ni FM layers and Pt metal layers (under or capping layers). The modulation of SOT can be achieved with other ferromagnetic materials and under or capping layer materials. In alternative implementations, the FM layer can be made of Co, Iron (Fe), Ni, nickel-iron alloy (NiFe), Cobalt-Iron alloy (CoFe), Cobalt-Iron-Boron alloy (CoFeB), Cobalt-Chromium-Platinum alloy (CoCrPt), Iron-Platinum alloy (FePt), Iron-Gadolinium alloy (FeGd), Gadolinium-Iron-Cobalt alloy (GdFeCo), Cobalt-Gadolinium alloy (CoGd), or $[XY]_n$, or $[XZ]_n$, wherein each of X and Y is independently Co, Fe, Ni, NiFe, CoFe, CoFeB, CoCrPt, FePt, FeGd, GdFeCo, Cobalt-Terbium alloy (CoTb), or CoGd, and Z is Pt, Tantalum (Ta), Palladium (Pd), Iridium (Ir), Hafnium (Hf), Lead (Pb), Tungsten (W), Copper (Cu), Aluminum (Al), Bismuth (Bi), Gold (Au), Ru, Rhodium (Rh), Molybdenum (Mo), Tellurium (Te), Selenium (Se), Antimony (Sb), Lanthanum (La), Strontium (Sr), Titanium (Ti), Yttrium (Y), Zirconium (Zr), G or a combination thereof, and n is an integer greater than 0. The FM layer may have a thickness of 0.1 to 1000 nm (preferably, 0.4-100 nm, and, more preferably, 0.6-10 nm).

Likewise, it should be understood that the additional semiconductor, insulator or metal layer is not restricted to Ru which is used as an example above, but can be implemented using a wide variety of other materials. In alternative implementations, the additional semiconductor, insulator or metal layer can be made of Pt, Ta, Pd, Ir, Hf, Pb, W, Cu, Al, Bi, Au, Rh, Mo, Te, Se, Sb, La, Sr, Ti, Y, Zr, Nb, Tc, Cd, In, Re, Os, Hg, Tl, Po, At, Gadolinium (Gd), Terbium (Tb), Ir, as well as their compounds (e.g., alloys, oxides, nitrides, etc.), various insulators, various semiconductors, or a combination thereof.

Figure 11A:
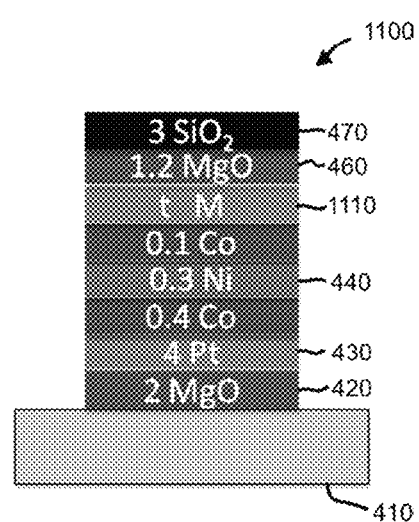
FIG. 11A is a schematic diagram of an example multilayer stack that includes an alternative additional metal layer adjacent to a FM layer.

FIG. 11A is a schematic diagram of an example multilayer stack 1100 that includes an alternative additional metal layer adjacent to a FM layer. The multilayer stack 1100 includes a substrate 410, a first spacer layer 420, a metal layer 430, a FM layer 440, a second spacer layer 460 and a capping layer 470 identical to FIG. 4A. However, rather than an Ru additional metal layer, an additional metal layer 1110 of another metal is employed, selected from the possibilities mentioned above.

Figure 11B:
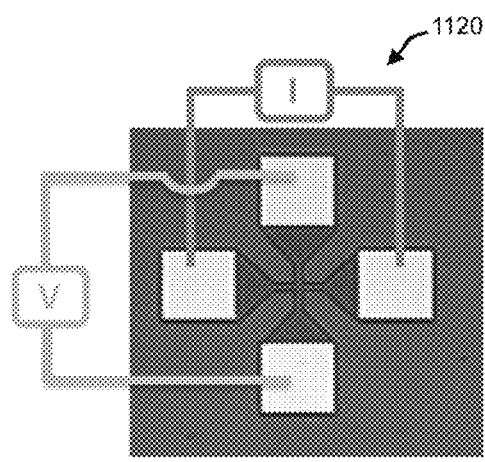
FIG. 11B is a microscopy image of an example patterned device produced for the layers of FIG. 11A having an example Hall bar cross structure (e.g., with 10 μm width)

FIG. 11B is a microscopy image of an example patterned device 1120 produced for the layers of FIG. 11A having an example Hall bar cross structure (e.g., with 10 μm width).

Figure 11C:
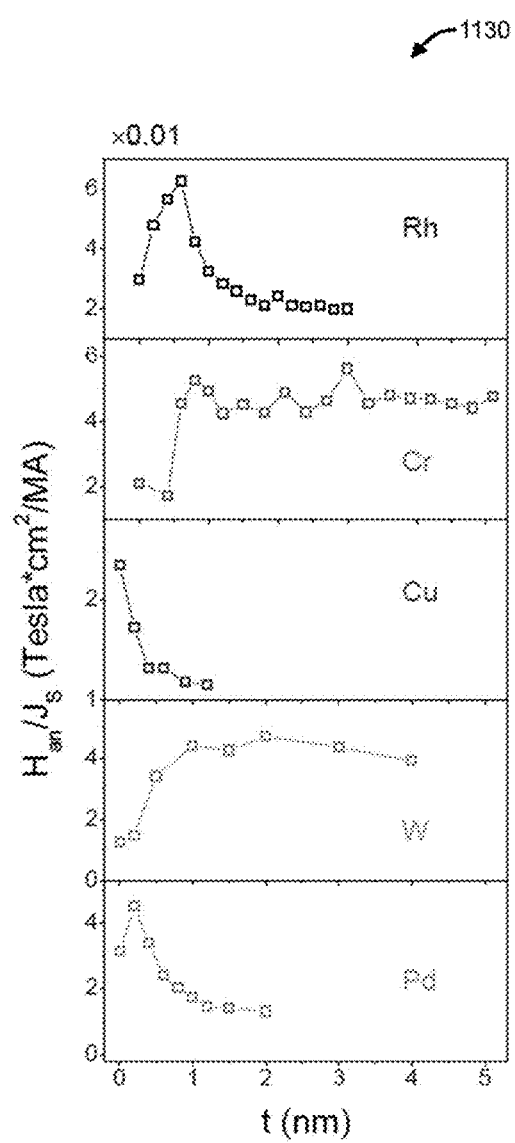
FIG. 11C is a graph showing example SO-STT switching efficiency versus the thickness of the additional metal layer (t), based on the example devices produced according to FIGS. 11A and 11B.

FIG. 11C is a graph 1130 showing example SO-STT switching efficiency versus t, based on the example devices produced according to FIGS. 11A and 11B. It can be seen that the modulation effect on SO-STT is not restricted to Ru.

Figure 12A:
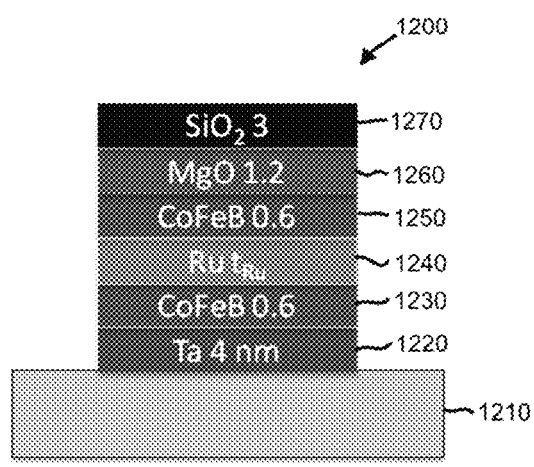
FIG. 12A is a schematic diagram of an example multilayer stack that includes an additional metal layer inserted between two alternative FM layers in the multilayer stack, and with an alternative metal layer, Ta.
Figure 12B:
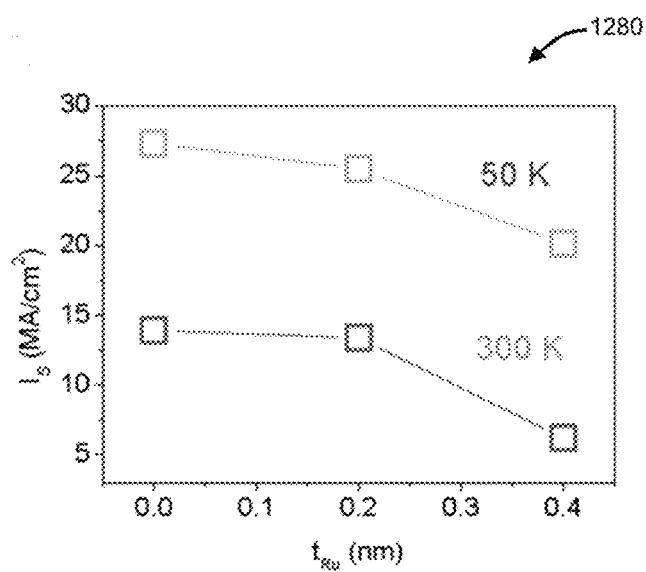
FIG. 12B is a graph showing example switching current ($I_S$) dependence on Ru thickness for example devices produced according to FIG. 12A with Ru thickness at 50 K and 300 K.

FIG. 12A is a schematic diagram of an example multilayer stack 1200 that includes an additional metal layer inserted between two alternative FM layers in the multilayer stack, and with an alternative metal layer. The multilayer stack 1200 includes, in order, a substrate 1210, a metal layer 1220 formed from 4 nm of Ta, a first FM layer 1230 formed from 0.6 nm of CoFeB, an additional metal layer 1240 formed from Ru of thickness $t_{Ru}$, a second FM layer 1250 formed from 0.6 nm of CoFeB, a spacer layer 1260 formed from 1.2 nm of MgO, and a capping layer 1270 formed from 3 nm of $SiO_2$. FIG. 12B is a graph 1280 showing example switching current (Is) dependence on Ru thickness for example devices produced according to FIG. 12A with Ru thickness at 50 K and 300 K.

Figure 13A:
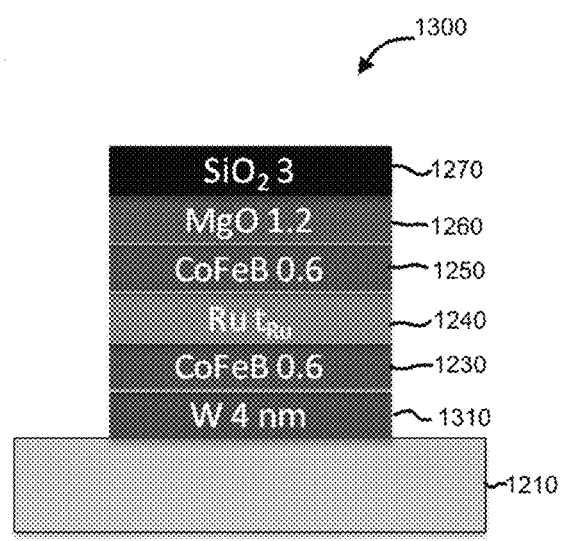
FIG. 13A is a schematic diagram of an example multilayer stack that includes an additional metal layer inserted between two alternative FM layers in the multilayer stack, and with an alternative metal layer, W.
Figure 13B:
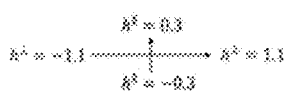
FIG. 13B is a graph showing example switching current ($I_S$) dependence on Ru thickness for an example device produced according to FIG. 13A.

FIG. 13A is a schematic diagram of an example multilayer stack 1300 that includes an additional metal layer inserted between two alternative FM layers in the multilayer stack, and with an alternative metal layer. The multilayer stack 1300 includes a substrate 1210, a first FM layer 1230, an additional metal layer 1240, a second FM layer 1250, a spacer layer 1260, and a capping layer 1270 as in FIG. 12A, but with a metal layer 1310 formed from 4 nm of W. FIG. 13B is a graph 1320 showing example switching current ($I_S$) dependence on Ru thickness for an example device produced according to FIG. 13A. In the examples of FIGS. 12A and 13A, one finds clear modulation effects on SOT, demonstrating applicability to other material combinations.

In conclusion, it should be understood that various adaptations and modifications may be made to the above discussed techniques. It should be appreciated that details included in the various example embodiments are merely provided for purposes of illustration, and are not intended to limit the scope, applicability, or configuration of the invention. For example, it should be understood that the various elements described above may be made from differing materials, implemented in different combinations or otherwise formed or used differently without departing from the intended scope of the invention.

What is claimed is:

1. A spin-orbit spin transfer torque (SO-STT) device, comprising:
    a first current injection line formed in the SO-STT device in a plane parallel to layers of a multilayer stack of the SO-STT device;
    a second current injection line formed in the SO-STT device in the plane that is disposed at a non-zero angle with respect to the first current injection line;
    a non-symmetric magnetic pattern located in the plane at an intersection of the first and second current injection lines, the non-symmetric magnetic pattern produced by tilting a shape of the magnetic pattern such that an axis of the magnetic pattern is disposed at a rotation angle with respect to the first current injection line or a center of the shape of the magnetic pattern is located away from a center of a current injection line,
    wherein the SO-STT device is switchable between up and down magnetization states by alternating current direction along the first current injection line and the second current injection line.

2. The SO-STT device of claim 1, wherein the STT device is switchable between the up and down magnetization states absent application of an external magnetic field.

3. The SO-STT device of claim 1, wherein the magnetic pattern exhibits triaxial anisotropy that is a combination of anisotropy perpendicular to the plane and shape anisotropy in the plane.

4. The SO-STT device of claim 1, wherein the first current injection line is along an x-axis of a coordinate system and the second current injection line is along a y-axis of the coordinate system, or the first current injection line is along the y-axis of the coordinate system and the second current injection line is along the x-axis of the coordinate system, and the up and down magnetization states are defined by a magnetization vector having a positive value with respect to a z-axis of the coordinate system or a negative value with respect to the z-axis of the coordinate system.

5. The SO-STT device of claim 1, wherein the non-symmetric magnetic pattern is a tilted magnetic pattern, and the absolute value of the rotation angle is between 0 and 90 degrees.

6. The SO-STT device of claim 1, wherein the non-symmetric magnetic pattern is a tilted magnetic pattern, and the absolute value of the rotation angle is 45 degrees.

7. The SO-STT device of claim 1, wherein the multilayer stack includes at least a semiconductor, insulator or metal layer, a ferromagnet (FM) layer, and an additional semiconductor, insulator or metal layer that is disposed either adjacent to the FM layer, or within the FM layer and that is configured to modulate SO-STT acting on the FM layer.

8. The SO-STT device of claim 7, wherein the additional semiconductor, insulator or metal layer is disposed adjacent to the FM layer, and the multilayer stack includes at least, in order, a substrate, the semiconductor, insulator or metal layer, the FM layer, the additional semiconductor, insulator or metal layer, and a capping layer.

9. The SO-STT device of claim 7, wherein the additional semiconductor, insulator or metal layer is disposed within the FM layer, and the multilayer stack includes at least, in order, a substrate, the semiconductor, insulator or metal layer, a first FM that forms a portion of the FM layer, the additional semiconductor, insulator or metal layer, a second FM that forms a portion of the FM layer, and a capping layer.

10. A method of switching a spin-orbit spin transfer torque (SO-STT) device having a non-symmetric geometry, the method comprising:
    alternating current direction along a first current injection line that is disposed in a plane parallel to the layers of the SO-STT device, to switch the device between an up state and a down state; and
    alternating current direction along a second current injection line that is disposed in the plane and that is at a non-zero angle with respect to the first current injection line, to switch the device between the down state and the up state,
    wherein the switching between the up state and the down state and the down state and the up state is performed absent application of an external magnetic field.

11. The method of claim 10, wherein the first current injection line is along an x-axis of a coordinate system and the second current injection line is along a y-axis of the coordinate system, or the first current injection line is along the y-axis of the coordinate system and the second current injection line is along the x-axis of the coordinate system, and the up and down magnetization states are defined by a magnetization vector having a positive value with respect to a z-axis of the coordinate system or a negative value with respect to the z-axis of the coordinate system.

12. The method of claim 11, wherein the switching between the up state and the down state is facilitated by an ellipse shaped magnetic pattern having an axis disposed at a rotation angle with respect to the x-axis, the absolute value of the rotation angle being between 0 and 90 degrees.

* * * * *